United States Patent
Kho et al.

(10) Patent No.: US 11,487,600 B2
(45) Date of Patent: Nov. 1, 2022

(54) ELECTRONIC CIRCUIT

(71) Applicant: Infineon Technologies AG, Neubiberg (DE)

(72) Inventors: Rex Kho, Holzkirchen (DE); Udo Elsholz, Munich (DE)

(73) Assignee: Infineon Technologies AG, Neubiberg (DE)

( * ) Notice: Subject to any disclaimer, the term of this patent is extended or adjusted under 35 U.S.C. 154(b) by 206 days.

(21) Appl. No.: 16/849,493

(22) Filed: Apr. 15, 2020

(65) Prior Publication Data

US 2020/0327007 A1 Oct. 15, 2020

(30) Foreign Application Priority Data

Apr. 15, 2019 (DE) .......................... 102019109869.6

(51) Int. Cl.
| | | |
|---|---|---|
| *G06F 11/00* | (2006.01) | |
| *G06F 11/07* | (2006.01) | |
| *H03K 5/24* | (2006.01) | |
| *G06F 1/06* | (2006.01) | |
| *H03K 21/08* | (2006.01) | |

(52) U.S. Cl.
CPC ............ *G06F 11/0772* (2013.01); *G06F 1/06* (2013.01); *G06F 11/0757* (2013.01); *H03K 5/24* (2013.01); *H03K 21/08* (2013.01)

(58) Field of Classification Search
CPC .... G06F 11/0772; G06F 1/06; G06F 11/0751; G06F 11/1604; G06F 11/3058
See application file for complete search history.

(56) References Cited

U.S. PATENT DOCUMENTS

| | | |
|---|---|---|
| 5,644,604 A | 7/1997 | Larson |
| 8,205,182 B1 | 6/2012 | Zlatanovici |
| 8,473,797 B2* | 6/2013 | Gupta .................... H03K 5/19 714/744 |
| 9,337,934 B1 | 5/2016 | Agazzi |
| 2002/0167857 A1 | 11/2002 | Magoshi |
| 2003/0174734 A1 | 9/2003 | Compton |
| 2007/0230647 A1* | 10/2007 | Pourbigharaz ........ H04L 7/0083 375/371 |
| 2008/0150605 A1 | 6/2008 | Chueh |
| 2014/0198810 A1 | 7/2014 | Jones |
| 2016/0191062 A1 | 6/2016 | Shivaram |
| 2018/0121280 A1* | 5/2018 | Sanders .............. G06F 11/0751 |

FOREIGN PATENT DOCUMENTS

| | | |
|---|---|---|
| CN | 106446366 A | 2/2017 |
| JP | H0476610 A | 3/1992 |
| JP | H0580873 A | 4/1993 |
| JP | H09212479 A | 8/1997 |

* cited by examiner

*Primary Examiner* — Charles Ehne
(74) *Attorney, Agent, or Firm* — Eschweiler & Potashnik, LLC

(57) ABSTRACT

According to various embodiments, an electronic circuit includes a plurality of clock generators wherein each clock generator is configured to store a counter value, to receive a reference clock, to change the counter value in accordance with the reference clock and to generate at least one clock signal based on the counter value. The circuit also includes a comparator configured to receive, for each of at least two of the plurality of clock generators, the counter value and compare the received counter values and an error handling circuit configured to initiate an error handling based on the result of the comparison.

19 Claims, 6 Drawing Sheets

ELECTRONIC CIRCUIT

REFERENCE TO RELATED APPLICATION

This application claims priority to German Application No. 10 2019 109 869.6, filed on Apr. 15, 2019, the contents of which are hereby incorporated by reference in their entirety.

FIELD

The present disclosure relates to electronic circuits.

BACKGROUND

A complex electronic circuit such as a system-on-chip (SoC) may have multiple clock domains, i.e. multiple circuit parts, wherein each part is supplied with its own clock signal or clock signals. Information transfer in digital logic may happen either between logic located in the same clock domain, or between different clock domain regions. In order to ensure synchronous communication, the phase relationship between the clock domains must remain constant. However, if, for example, ionizing radiation were to strike sensitive clock generation components within a clock domain, it is possible that this would bring the phase relationship between this clock domain and other clock domains out of step. If this were to occur, synchronous communication between this domain and the other domains would not be guaranteed and this could potentially lead to complete system failure. Therefore approaches to detect such a situation in order to start appropriate counter measures are desirable.

SUMMARY

According to various embodiments, an electronic circuit is provided including a plurality of clock generators, wherein each clock generator is configured to store a counter value, to receive a reference clock, to change the counter value in accordance with the reference clock, and to generate at least one clock signal based on the counter value. The electronic circuit also includes a comparator configured to receive, for each of at least two of the plurality of clock generators, the counter value and compare the received counter values, and an error handling circuit configured to initiate an error handling based on the result of the comparison.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects are described with reference to the following drawings, in which.

DETAILED DESCRIPTION

The following detailed description refers to the accompanying drawings that show, by way of illustration, specific details and aspects of this disclosure in which the invention may be practiced. Other aspects may be utilized and structural, logical, and electrical changes may be made without departing from the scope of the invention. The various aspects of this disclosure are not necessarily mutually exclusive, as some aspects of this disclosure can be combined with one or more other aspects of this disclosure to form new aspects.

Figure 1:
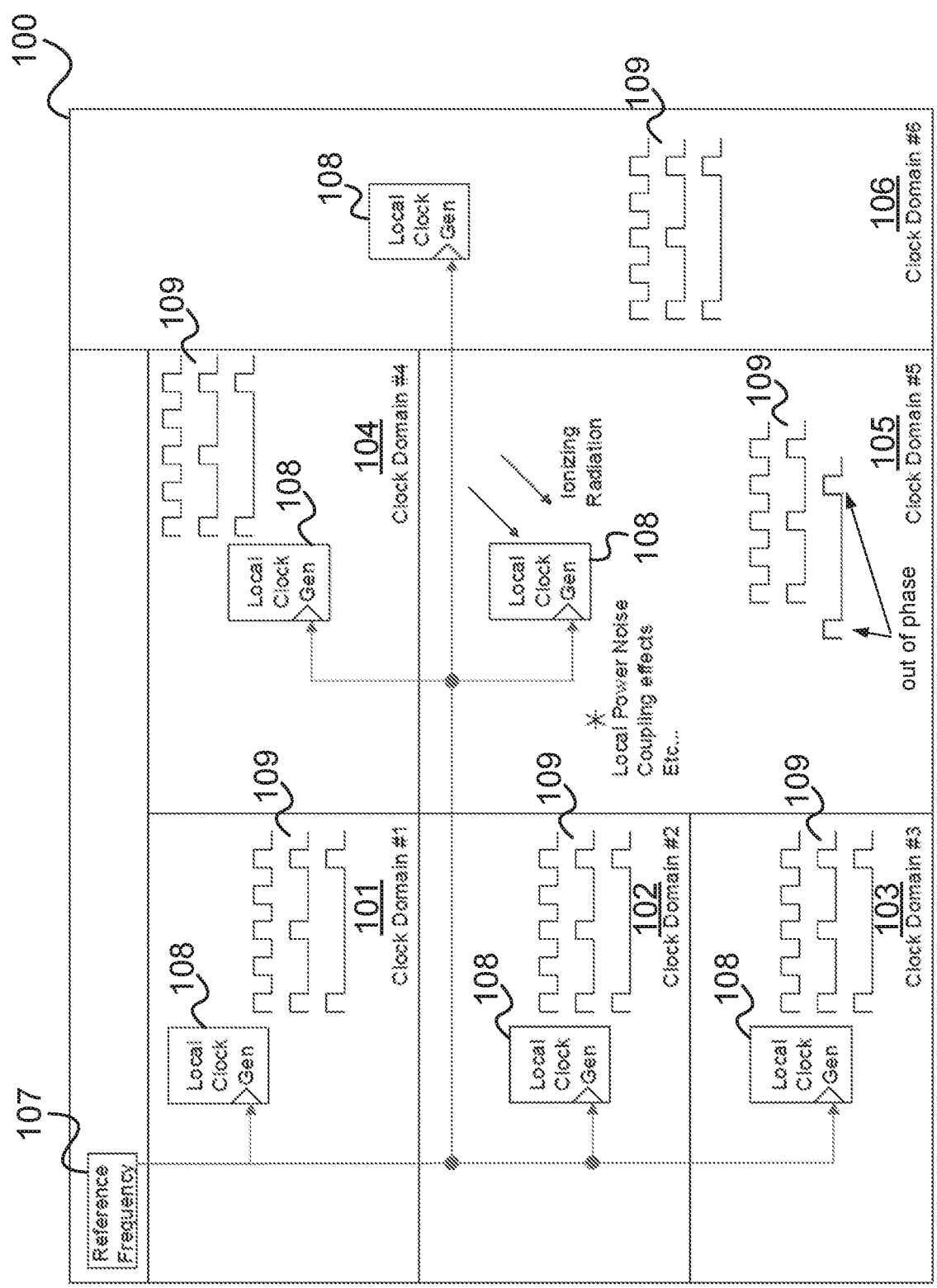
FIG. 1 illustrates generation and usage of multiple clock domains in a chip and potential safety issues for synchronous communication between multiple domains.

FIG. 1 illustrates generation and usage of multiple clock domains 101 to 106 in a chip 100 and potential safety issues for synchronous communication between multiple domains.

The chip 100 includes a reference frequency generator 107 such as a circuit or crystal oscillator. Each clock domain 101 to 106 has a respective associated local clock generator circuit 108. The reference frequency generator 107 supplies each local clock generator 108 with a reference frequency signal (or reference clock signal) and each local clock generator 108 generates one or more local clock signals 109 for its associated clock domain 101 to 106. For example, each clock domain 101 to 106 includes logic components such as logic gates, memory cells, buffers, inverters etc. which operate according to one of the one or more local clock signals.

Figure 2:
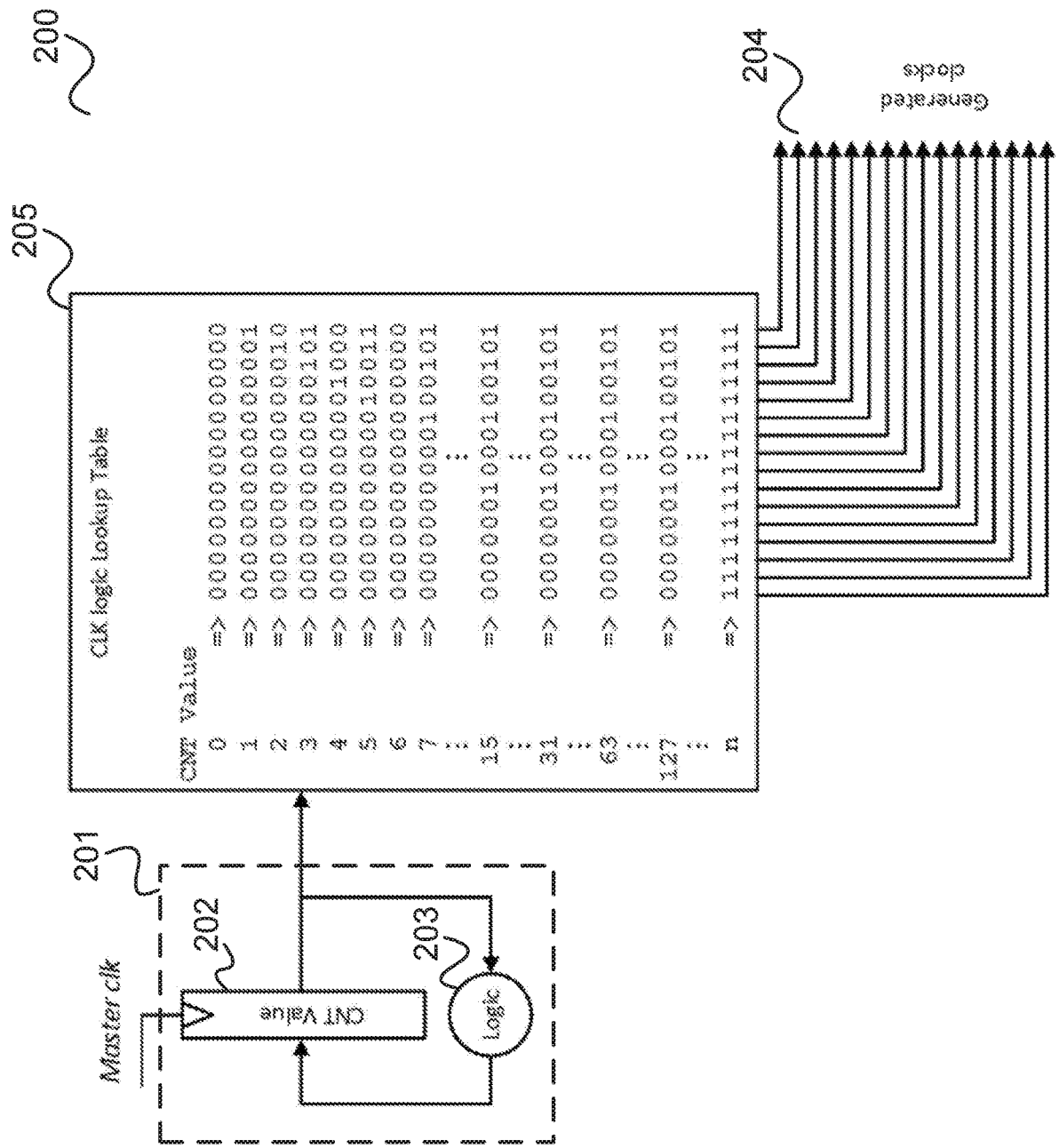
FIG. 2 shows a local clock generator.

The generation of local clock signals by a local clock generator is illustrated in FIG. 2.

FIG. 2 shows a local clock generator circuit 200.

The local clock generator 200 includes a counter 201 which receives a reference (or master) clock signal (e.g. corresponding to the reference frequency signal provided by the reference frequency generator 107).

The counter 201 stores a counter value in a counter value register 202 and increments the counter value in accordance with the reference clock signal by means of a logic circuit 203 (e.g. an adder adding a 1 for each clock cycle of the master clock). For example, the logic 203 increases the counter value by one with each pulse, e.g. each rising edge, of the reference clock signal, by reading out the counter value and storing the incremented counter value in the counter value register 202. To avoid overflow, the logic 203 may do this cyclically, e.g. reduce the counter value to zero when a maximum counter value n would be exceeded by the incrementation (i.e. starts anew with zero or another initial value). The counter may also be a decrementing counter (which counts downwards). Further, in one embodiment the counter may be configured to divide the reference clock, i.e. for example only change the counter value with every other clock cycle of the reference clock signal.

Depending on the current counter value, the clock generator circuit 200 outputs certain levels of the local clock signals 204 it is configured to generate. In this example, the clock generator 200 is configured to generate and output 16 local clock signals. The clock generator 200 sets the levels of the local clock signals 204 in accordance with a lookup table 205. In one embodiment the table maps each counter value (in this example between 0 and n) to one of n+1 16 bit numbers, wherein the value of a bit of a 16 bit number specifies the level of a local clock signal 204 corresponding to that bit. For example, the clock signal corresponding to the rightmost bit changes its level with each change of the counter value and thus has the highest frequency among the local clock signals 204.

Errors may occur if one of the local clock generators 108 of FIG. 1 fails and generates a local clock signal 109 which has an error, e.g. which misses a pulse, has an extra pulse or has a phase which is not correct (e.g. by a couple of picoseconds, i.e. a time (much) smaller than the period of the clock signal). In the example illustrated in FIG. 1, the third clock signal of the clock signals 109 of the fifth clock domain 105 is out of phase. This may, for example, happen due to ionizing radiation 111 hitting the local clock generator 108 of the fifth clock domain 105 causing malfunction of the local clock generator. For example, the ionizing radiation 111 hits the register 202 and flips a bit of the counter value in the register 202 such that the counter value is changed and, as illustrated in FIG. 1, the pulse of clock signal comes to early. Errors may also be caused by local power noise, coupling effects etc.

An error in a local clock signal in one clock domain as illustrated in FIG. 1 may lead to (in the worst case) a complete failure of the electronic circuit 100 since correct communication (synchronous communication based on the local clock signals 109) between the clock domains 101 to 106 may no longer be possible.

One possibility to avoid such an issue is to collect phase information per clock domain and compare the phase information in a central location (i.e. by means of a central unit on the chip). This is illustrated in FIG. 3.

Figure 3:
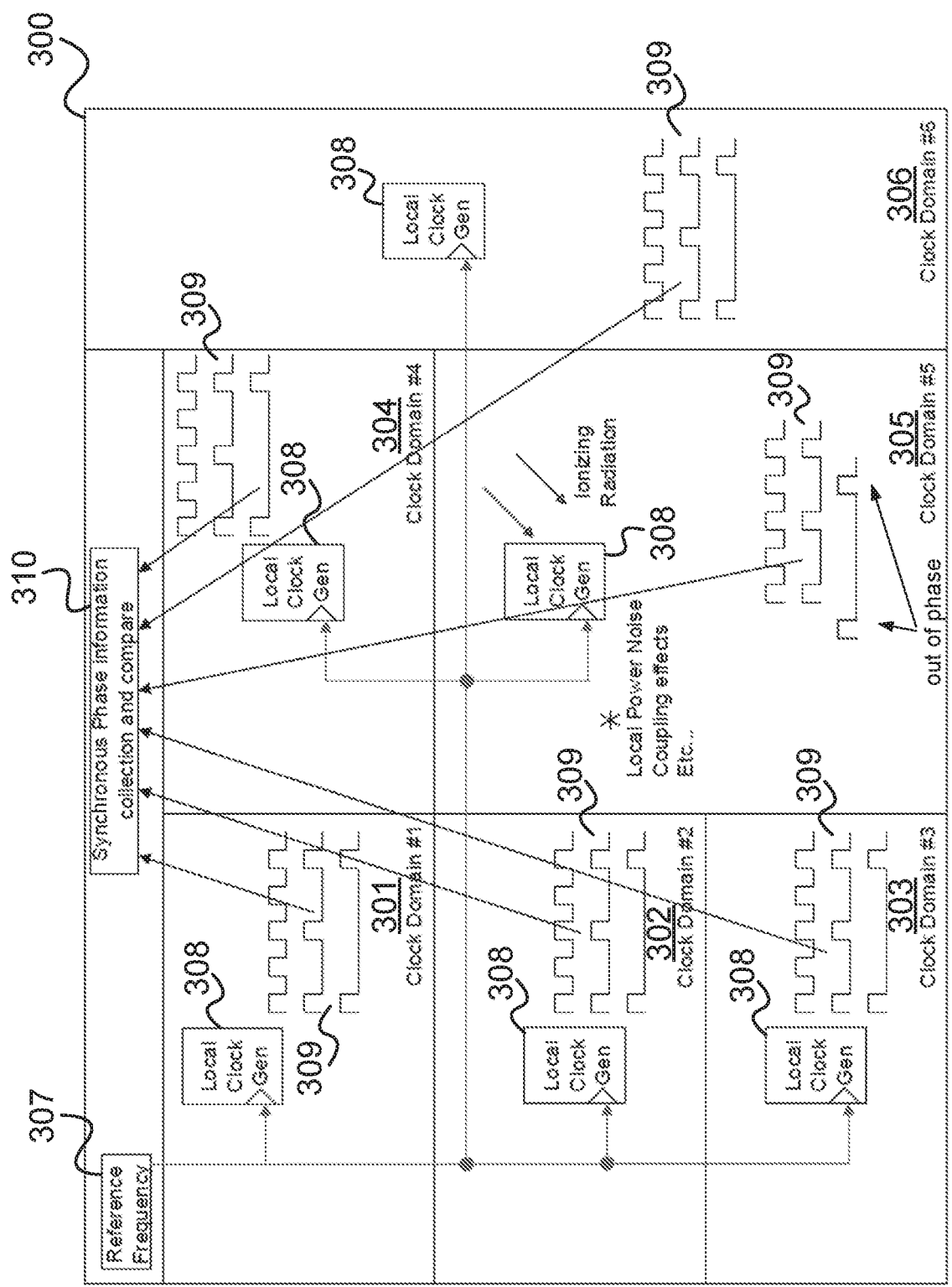
FIG. 3 shows a chip with multiple clock domains and a central phase comparator.

FIG. 3 shows a chip 300 with multiple clock domains 301 to 306 and a central phase comparator 310.

Similarly to the chip 100 of FIG. 1, the chip 300 includes a reference frequency generator 307 and each clock domain 301 to 306 has a respective associated local clock generator circuit 308 which is supplied by the reference frequency generator 307 with a reference frequency signal. Each local clock generator 308 generates one or more local clock signals 309 for its associated clock domain 301 to 306. The clock domains may, as mentioned above, comprise logic circuits or memory circuits (implemented by means of semiconductor elements such as field effect transistors, e.g. in CMOS (Complementary Metal-Oxide-Semiconductor) technology).

The central phase comparator circuit 310 gathers phase information of the local clock signals 309 and compares the phases of the clock signals 309 to check for phase differences between the clock domains 301 to 306. In case the phases of the local clock signals do not satisfy predetermined criteria (e.g. differ too much from one another), the central phase comparator 310 may initiate an error handling procedure (e.g. output an alarm signal). It should be noted that an error (i.e. a violation of the predetermined criteria) may be that the clock signals differ two much, meaning that the positions of the edges of the pulses differ (by more than a certain threshold), but there are no pulses in one clock signal that are not there in the other, i.e. the edges differ but by much less than the period of the clock signals. That type of error is also referred to as a skew of the clock signals. Another type of error is that there is a pulse in the first clock signal that is not there in the second clock signal because of an extra pulse in the first clock signal or a missing pulse in the second clock signal. A comparator only reacting to the skew being above a threshold may not react to such an error because the edges of the pulses (present in both clock signals) may match perfectly.

The approach of FIG. 3 requires synchronous transmission of the phase information to a central location. In the case where the transmission distance requires more than one clock period, this may be achieved by pipelining the data with data registers. If there is significant amount of data, the number of data registers and signal lines may become significant. The transmission of the phase information to the central location may involve crossing multiple clock domains. The data registers must then be pre-placed in multiple clock domains. However, pipelining of the data increases latency between phase information generation and its comparison. Thus, there may be a relatively large latency between error generation and error recognition. Furthermore, the transfer of the data over multiple clock domains is potentially problematic if the phase relationship between the clock domains is not correct.

Therefore, according to various embodiments, an approach is provided based on locally comparing phase information only between neighboring domains.

Figure 4:
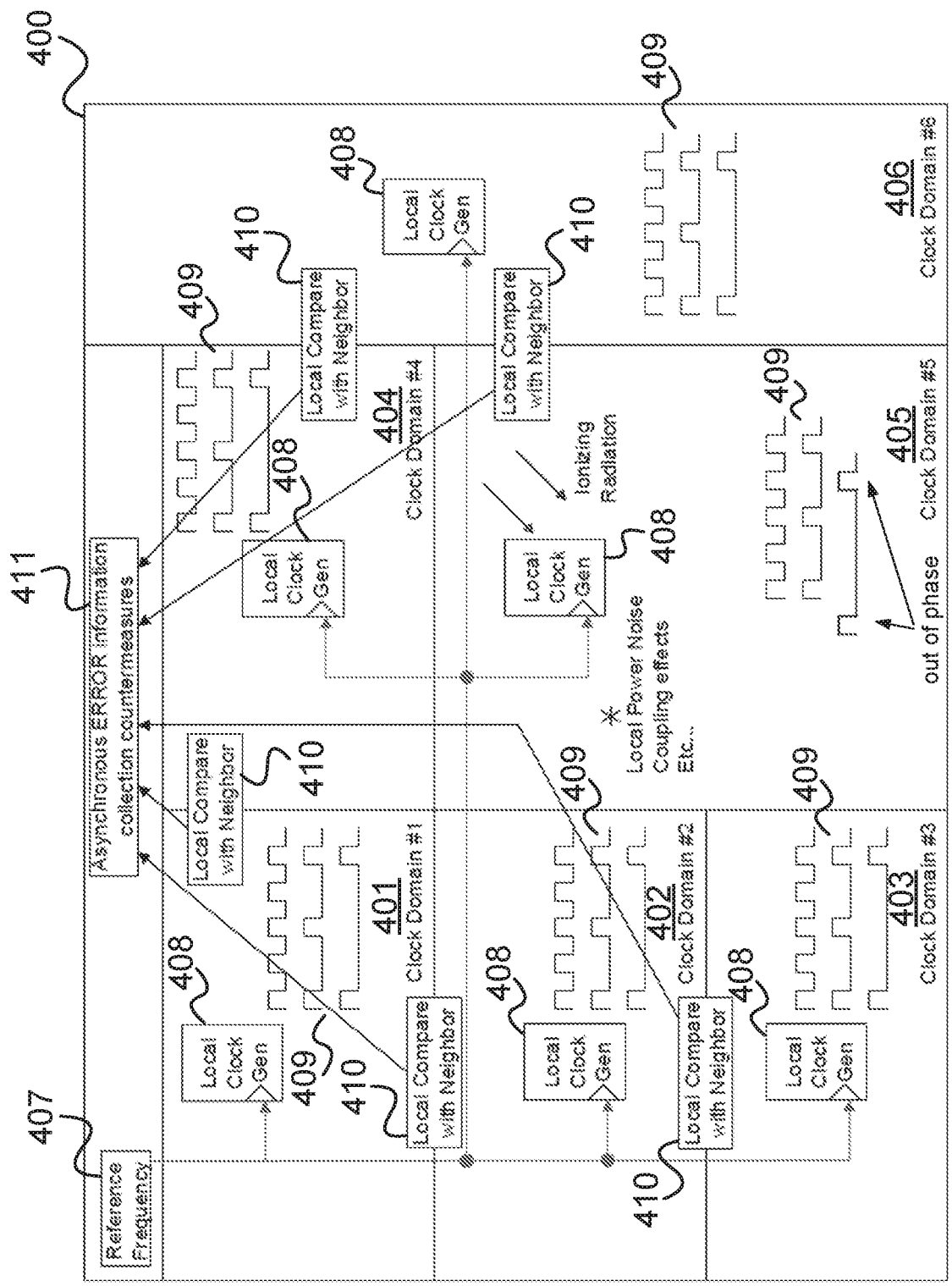
FIG. 4 shows a chip with multiple clock domains and local comparators.

FIG. 4 shows a chip 400 with multiple clock domains 401 to 406 and local comparators 410.

Similarly to the chip 100 of FIG. 1, the chip 400 includes a reference frequency generator circuit 407 and each clock domain 401 to 406 has a respective associated local clock generator circuit 408 which is supplied by the reference frequency generator 407 with a reference frequency signal. Each local clock generator 408 generates one or more local clock signals 409 for its associated clock domain 401 to 406.

In contrast to FIG. 3, the chip 400 includes a local comparator circuit 410 for each pair of neighboring clock domains 401 to 406.

The local comparator 410 compares phase information of the neighboring clock domains 401 to 406 to which it belongs and, if it finds an error, reports the error by means of error information to a central error collection circuit 411. Phase information may be understood as information which defines the times at which pulses in the local clock signals 409 occur. According to various embodiments, as described below, this may be the counter value of the counter 201 of a local clock generator 408. Since the counter value may be used to generate a plurality of local clock signals 409, the correctness of a plurality of local clock signals 409 may thus be monitored by comparing a single value (the counter value) between different domains.

The central error collection circuit 411 acts as safety management circuit and may initiate an error handling operation in response to the report of an error from one (or more) of the local comparators 410. For example, it may control the chip 400 to enter a safe state, disable one or more components of the chip or output a signal indicating a malfunction of the chip 400 to another component (such as a central control unit in a vehicle).

According to various embodiments, a local comparison of phase information is performed only between neighboring domains. For example, according to various embodiments, there is no central comparator as in FIG. 3. Thus, the phase information is local data (i.e. is processed locally) and it is not necessary to send it send over the entire chip, e.g. to a central location. Thus, latency of data comparison is reduced with respect to an approach with central comparison as illustrated in FIG. 3. In particular, with the approach of FIG. 4, there is no need to pipeline data over chip (over potentially problematic clock domains).

According to various embodiments, the transmission of error information from the local comparators 410 to the central error collection circuit 411 for global collection is asynchronous. For example, each local comparator indicates an error by means of an error message which is a data message which is not reliant on the operation of local clocks.

Furthermore, the approach of FIG. 4 can be implemented with a lower number of signal lines than the approach of FIG. 3. An error message for transmitting the error information may be as simple as a pulse or a flag over a single signal line. Thus, in the examples of FIG. 3, only 5 error data lines may be used for transmitting the error information for global collection in the approach of FIG. 4 while 6 times m lines are used in the approach of FIG. 3 to transmit m-bit phase information.

According to various embodiments, there is a protection in pairs only. This means that each clock domain only shares a local comparator 410 with one neighboring clock domain (instead of multiple or all clock domains). In that case, in the example of FIG. 4 with six clock domains (and thus three clock domain pairs), three error lines suffice for sending the error information for central collection (i.e. central monitoring).

For example, a comparison scheme according to a ring structure may be used. This corresponds to the illustration of FIG. 5 where one counter value is input and one counter value is output: for example, the fourth clock domain 404 compares its counter value with that of the first clock domain (with a respective comparator), the first clock domain 401 compares its counter value with the counter value of the second clock domain 402 and so on. Thus, each clock domain has two neighbors for comparison (but only provides its own counter value to one neighbor).

Thus, for example, for the fourth clock domain 404, there is a comparison between the fourth clock domain 404 and the sixth clock domain 406 and between the fourth clock domain 404 and the first clock domain 401. When there is a comparison of counter values in this manner, and an error occurs (only) in the fourth clock domain 404, the central error collection unit should receive an error message from the first clock domain 401, the fourth clock domain 404 and the sixth clock domain. Thus, the central error collection unit can determine that the error is in the fourth clock domain 404 rather than the first clock domain 404 and the sixth clock domain 406 since their other neighbors do not send an error message.

According to various embodiments, the phase information that the local comparators 410 compare between neighboring clock domains are the counter values stored by the counter value registers 202 of the local clock generators 410. An error which a local comparator 410 detects and reports would then for example be that the counter values of local comparators 410 of neighboring clock domains 401 to 406 differ or, in case an offset between the counter values is set or allowed, that the difference (offset) between the counter values of local comparators 410 of neighboring clock domains 401 to 406 is not as intended (e.g. has changed its predetermined value).

This approach allows in particular to detect missing pulses which occur due to a wrong counter value. Suppose, for example, that the counter counts 1, 2, 2, 4 instead of 1, 2, 3, 4. This may arise due to the fact that ionizing radiation temporarily reduces a voltage level in the counter register such that the third number is interpreted as a 2 instead of a 3 (e.g. the lowest bit is read out as 0 instead of a 1). Suppose that the local clock signal is supposed to have pulses at 1 and 3, a pulse would be missing in this example. A comparator which determines whether there is a skew between clock edges between neighboring clock domains may not see an error in this case since the phase of the (existing) pulses may be exactly the same between the neighboring clock domains.

Figure 5:
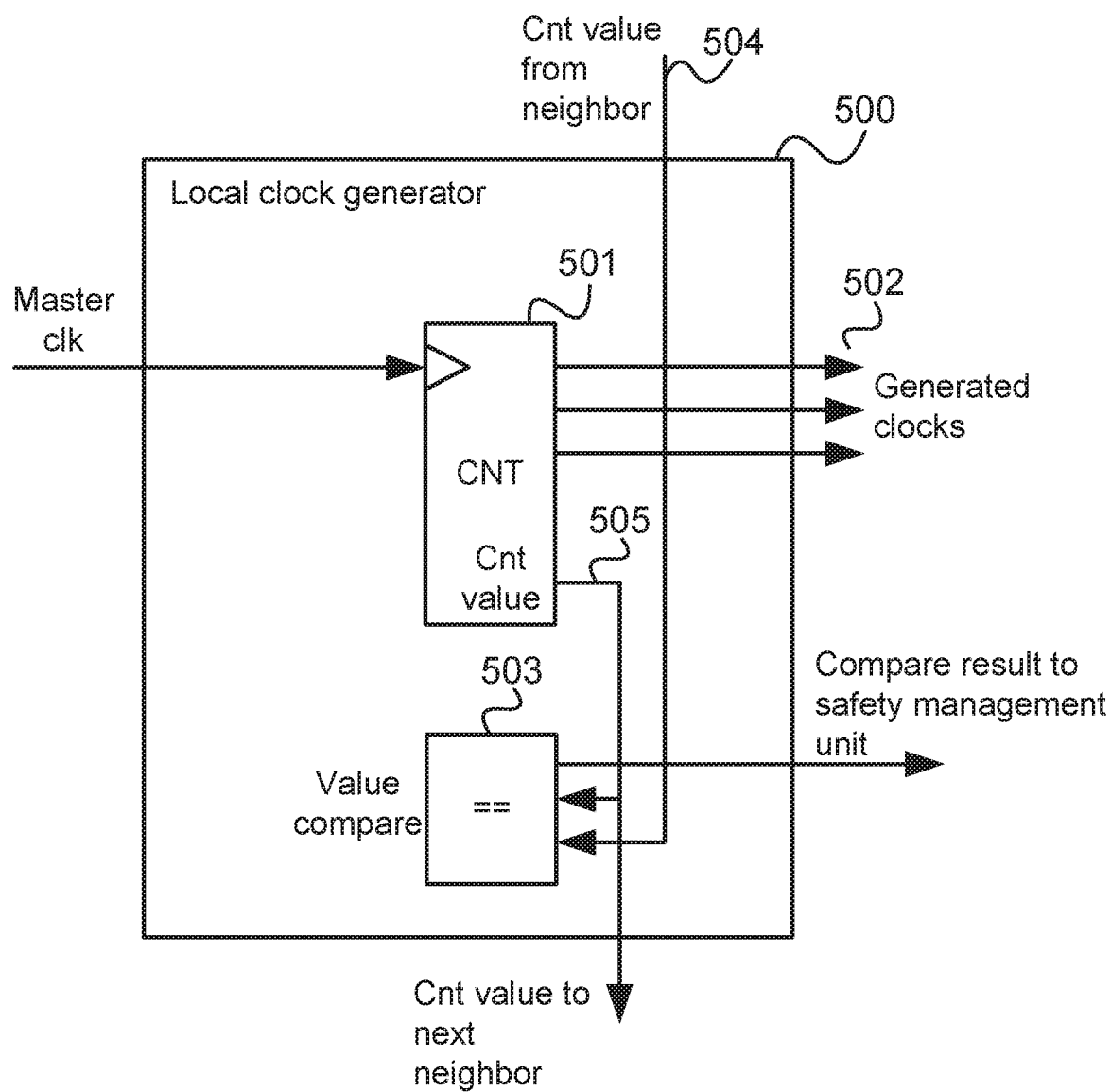
FIG. 5 shows a local clock generator having a local comparator.

FIG. 5 shows a local clock generator circuit 500 having a local comparator 503.

The local clock generator circuit 500 may be used to implement one of the local clock generators 408 for a clock domain 401 to 406 and a local comparator 410 to one of the neighboring clock domains 401 to 406.

The local comparator circuit 503 does not necessarily have to be incorporated in one of the local clock generators 408 like in the example of FIG. 5. It may also be provided externally to the local clock generators, e.g. at a boundary of clock domains. Furthermore, a local clock generator 408 may also be provided without a local comparator 503 incorporated therein.

Similarly to the example of FIG. 2, the local clock generator circuit 500 includes a counter 501 and generates one or more local clock signals 502 based on the counter value, e.g. using a lookup table as explained with reference to FIG. 2 or by another mechanism.

The counter value stored in the counter 501 is supplied to the local comparator 503. Further, a first counter value signal line 504 connected to local clock generator 410 of a neighboring clock domain supplies the counter value of the local clock generator of the neighboring clock domain to the local comparator 503. Similarly, a second counter value signal line 505 may supply the counter value of the counter 501 to another local comparator (e.g. incorporated in a local clock generator of another neighboring clock domain for clock comparison with the other neighboring clock domain).

The local comparator 503 is configured to compare the counter value of the counter 501 with the counter value of the local clock generator of the neighboring clock domain and to output an error signal based on the result of the comparison. For example, the local comparator 503 outputs an error message indicating an error if the counter value of the counter 501 with the counter value of the local clock generator of the neighboring clock domain do not match, e.g. differ from each other or differ more or less than a predetermined offset (in general, if they do not fulfil a predetermined criterion with respect to each other). It should be noted that a determination whether two compared counter values "match", i.e. whether the comparison has a positive result, may include calculations such as a scaling since the counter values may be scaled differently with respect to each other, taking into account an offset (which is for example supposed to exist between the counter values) etc.

Figure 6:
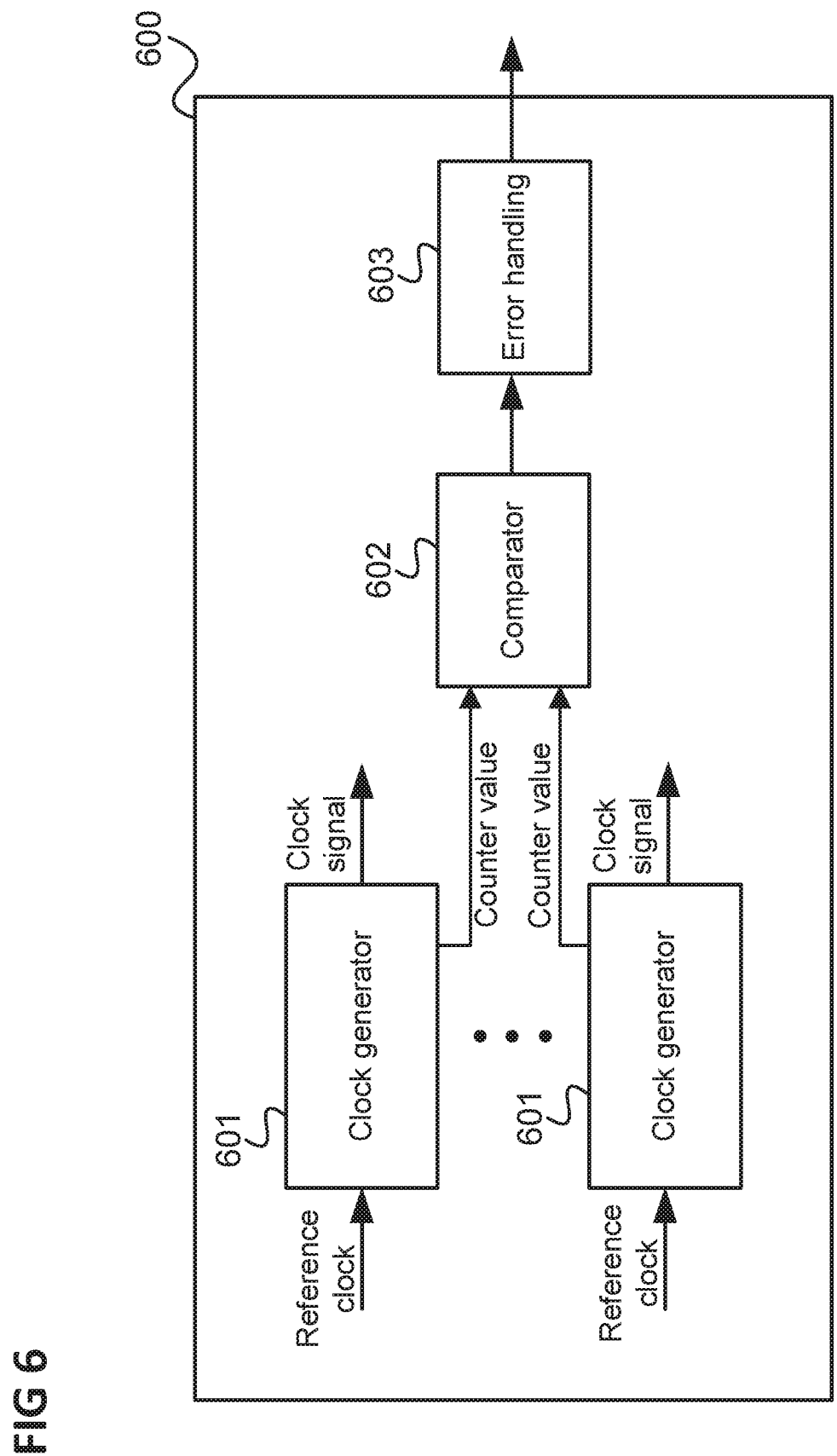
FIG. 6 shows an electronic circuit.

In summary, according to various embodiments, an electronic circuit is provided as illustrated in FIG. 6.

FIG. 6 shows an electronic circuit 600.

The electronic circuit 600 includes a plurality of clock generator circuits 601, wherein each clock generator 601 is configured to store a counter value, to receive a reference clock to change the counter value in accordance with the reference clock and to generate at least one clock signal based on the counter value.

The electronic circuit 600 further includes a comparator circuit 602 configured to receive, for each of at least two of the plurality of clock generators 601, the counter value and compare the received counter values and an error handling circuit 603 configured to initiate an error handling based on the result of the comparison.

According to various embodiments, in other words, the correctness of one or more generated clock signals is monitored locally by a comparison of counter values, based on which clock signals are generated, among (e.g. neighboring) clock domains. The local clock generators whose counter values are compared do not have to be of neighboring clock domains but it may be desirable to compare counter values of local clock generators which belong to clock domains which are located close to each other on the electronic circuit to avoid the necessity to transmit counter values over long distances over the electronic circuit. The error handling circuit may be a central error handling circuit which is configured to receive the results of the comparisons of multiple comparators. The error handling circuit may be configured to initiate error handling (e.g. output of an alarm signal) in case that the result of any comparison indicates an error. Thus, the comparators and the error handling circuit may implement a multi-domain clock synchronicity checker.

The electronic circuit 600 may for example be implemented by a (computer) chip. It may for example be an electronic circuit having a control functionality, such as a microcontroller for a control device like an electronic control unit (ECU) in a vehicle.

Various Examples are described in the following:

Example 1 is an electronic circuit as illustrated in FIG. 6.

Example 2 is the electronic circuit according to Example 1, wherein the comparator is configured to transmit a comparison signal representing the result of the comparison to the error handling circuit.

Example 3 is the electronic circuit according to Example 2, wherein the comparison signal indicates whether the comparator has detected an error based on the comparison.

Example 4 is the electronic circuit according to any one of Examples 1 to 3, wherein the comparing of the received counter values by the comparator comprises checking whether the compared counter values do fulfil a predetermined criterion with respect to each other.

Example 5 is the electronic circuit according to Example 4, wherein the predetermined criterion is whether the compared counter values match or whether the compared counter values match up to a predetermined offset.

Example 6 is the electronic circuit according to Example 4, wherein the predetermined criterion is whether the compared counter values have been correctly changed in accordance with the reference clock.

Example 7 is the electronic circuit according to any one of Examples 4 to 6, wherein the comparator is configured to output an error message to the error handling circuit if the compared counter values do not fulfil the predetermined criterion with respect to each other.

Example 8 is the electronic circuit according to any one of Examples 1 to 7, wherein the error handling circuit is configured to initiate an error handling if the compared counter values do not fulfil a predetermined criterion with respect to each other.

Example 9 is the electronic circuit according to any one of Examples 1 to 8, comprising a plurality of comparators, wherein each comparator is configured to receive, from each clock generator of a respective pair of clock generators of the plurality of clock generators, the counter value and compare the received counter values.

Example 10 is the electronic circuit according to Example 9, wherein each comparator of the plurality of comparators is configured to transmit a comparison signal representing the result of the comparison to the error handling circuit.

Example 11 is the electronic circuit according to any one of Examples 1 to 10, wherein the error handling circuit is a central unit configured to collect multiple comparison signals from multiple comparators and configured to initiate an error handling based on the comparison signals.

Example 12 is the electronic circuit according to Examples 11, wherein the error handling circuit is configured to initiate an error handling if any one of the comparison signals indicates that the comparator which has sent the comparison signal has detected an error.

Example 13 is the electronic circuit according to any one of Examples 1 to 12, wherein the electronic circuit comprises a plurality of clock domains and each clock generator is associated with a respective one of the clock domains.

Example 14 is the electronic circuit according to Example 13, wherein the comparator is located at the border of two clock domains with which the clock generators whose counter values it is configured to compare are located.

Example 15 is the electronic circuit according to any one of Examples 1 to 14, wherein the clock generator is configured to cyclically increment the counter value in accordance with the reference clock signal or is configured to cyclically decrement the counter value in accordance with the reference clock signal.

Example 16 is the electronic circuit according to any one of Examples 1 to 15, wherein the electronic circuit comprises at least one of logic components and memory components operated in accordance with the clock signal generated by the clock generator.

Example 17 is the electronic circuit according to any one of Examples 1 to 16, wherein the clock generator is configured to generate multiple clock signals of different frequencies.

Example 18 is a method for monitoring clock signals comprising receiving, for each of at least two clock generators, a respective counter value, wherein each clock generator stores the respective counter value, receives a reference clock, changes the counter value in accordance with the reference clock and generates at least one clock signal based on the counter value, comparing the received counter values and initiating an error handling based on the result of the comparison.

Example 19 is the method of Example 18, wherein initiating an error handling comprises triggering an alarm.

Example 20 is the method according to Example 18, comprising transmitting a comparison signal representing the result of the comparison to an error handling circuit.

Example 21 is the method according to Example 20, wherein the comparison signal indicates whether an error has been detected based on the comparison.

Example 22 is the method according to any one of Examples 18 to 21, wherein the comparing of the received counter values comprises checking whether the compared counter values do fulfil a predetermined criterion with respect to each other.

Example 23 is the method according to Example 22, wherein the predetermined criterion is whether the compared counter values match or whether the compared counter values match up to a predetermined offset.

Example 24 is the method according to Example 22, wherein the predetermined criterion is whether the compared counter values have been correctly changed in accordance with the reference clock.

Example 25 is the method according to any one of Examples 22 to 24, comprising outputting an error message if the compared counter values do not fulfil the predetermined criterion with respect to each other.

Example 26 is the method according to any one of Examples 18 to 25, wherein the error handling circuit is configured to initiate an error handling if the compared counter values do not fulfil a predetermined criterion with respect to each other.

Example 27 is the method according to any one of Examples 18 to 26, comprising receiving, from each clock generator of a respective pair of clock generators of the plurality of clock generators, the counter value and comparing the received counter values.

Example 28 is the method according to Example 27, comprising, for each comparison, a comparison signal representing the result of the comparison to an error handling circuit.

Example 29 is the method according to any one of Examples 18 to 28, comprising centrally collecting multiple comparison signals from multiple comparators and initiating an error handling based on the comparison signals.

Example 30 is the method according to Examples 29, wherein comprising initiating an error handling if any one of the comparison signals indicates that the comparator which has sent the comparison signal has detected an error.

Example 31 is the method according to any one of Examples 18 to 30, wherein each clock generator is associated with a respective one of a plurality of clock domains.

Example 32 is the method according to Example 31, comprising receiving and comparing the received counter values at the border of two clock domains with which the clock generators whose counter values are compared are located.

Example 33 is the method according to any one of Examples 18 to 32, comprising cyclically incrementing the counter value in accordance with the reference clock signal or cyclically decrementing the counter value in accordance with the reference clock signal.

Example 34 is the method according to any one of Examples 18 to 33, comprising operating at least one of logic components and memory components in accordance with the clock signal generated by the clock generator.

Example 35 is the method according to any one of Examples 18 to 34, comprising generating multiple clock signals of different frequencies.

According to a further example, an electronic circuit is provided comprising a plurality of clock domains, each clock domain comprising a plurality of clocked data processing components, and a clock generator for each clock domain, wherein the clock generator of each clock domain is configured to generate at least one clock signal for the plurality of clocked data processing components based on a counter value, a comparator configured to receive, for each of at least two of the plurality of clock domains, the counter value, to check whether the received counter values fulfill a predetermined criterion with respect to each other and to report an error in case that the counter values do not fulfill the predetermined criterion with respect to each other.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. An electronic circuit formed on a chip, the electronic circuit, comprising:
a plurality of clock generator circuits;
a reference clock generator circuit;
wherein each clock generator circuit is configured to:
store a counter value;
receive a reference clock from the reference clock generator circuit; and
change the counter value in accordance with the reference clock and to generate at least one clock signal based on the counter value;
a comparator circuit configured to receive, for each of at least two of the plurality of clock generator circuits, the counter value and compare the received counter values; and
an error handling circuit configured to selectively output an error signal or initiate an error handling operation based on a result of the comparison.

2. The electronic circuit according to claim 1, wherein the comparator circuit is configured to transmit a comparison signal representing the result of the comparison to the error handling circuit.

3. The electronic circuit according to claim 2, wherein the comparison signal indicates whether the comparator circuit has detected an error based on the comparison result.

4. The electronic circuit according to claim 1, wherein the comparing of the received counter values by the comparator circuit comprises checking whether the compared counter values fulfill a predetermined criterion with respect to each other.

5. The electronic circuit according to claim 4, wherein the predetermined criterion is whether the compared counter values match or whether the compared counter values match up to a predetermined offset.

6. The electronic circuit according to claim 4, wherein the predetermined criterion is whether the compared counter values have been correctly changed in accordance with the reference clock.

7. The electronic circuit according to claim 4, wherein the comparator circuit is configured to output an error message to the error handling circuit if the compared counter values do not fulfill the predetermined criterion with respect to each other.

8. The electronic circuit according to claim 1, wherein the error handling circuit is configured to initiate the error handling operation if the compared counter values do not fulfill a predetermined criterion with respect to each other.

9. The electronic circuit according to claim 1, comprising a plurality of comparator circuits, wherein each comparator circuit is configured to receive, from each clock generator circuit of a respective pair of clock generator circuits of the plurality of clock generator circuits, the counter value and compare the received counter values.

10. The electronic circuit according to claim 9, wherein each comparator circuit of the plurality of comparator circuits is configured to transmit a comparison signal representing the result of the comparison to the error handling circuit.

11. The electronic circuit according to claim 1, wherein the error handling circuit is a central circuit configured to collect multiple comparison signals from multiple comparator circuits and configured to initiate the error handling operation based on the comparison signals.

12. The electronic circuit according to claim 11, wherein the error handling circuit is configured to initiate the error handling operation if any one of the comparison signals indicates that the comparator which has sent the comparison signal has detected an error.

13. The electronic circuit according to claim 1, wherein the electronic circuit comprises a plurality of clock domains and each clock generator circuit is associated with a respective one of the clock domains.

14. The electronic circuit according to claim 13, wherein a counter is located at a border of two clock domains with which the clock generators whose counter values it is configured to compare are located.

15. The electronic circuit according to claim 1, wherein the clock generator circuit is configured to cyclically increment the counter value in accordance with the reference clock or is configured to cyclically decrement the counter value in accordance with the reference clock.

16. The electronic circuit according to claim 1, wherein the electronic circuit comprises at least one of logic circuits and memory circuits operated in accordance with the clock signal generated by the clock generator circuit.

17. The electronic circuit according to claim 1, wherein the clock generator circuit is configured to generate multiple clock signals of different frequencies.

18. A method for monitoring clock signals, comprising:
receiving, for each of at least two clock generator circuits of an electronic circuit formed on a chip, a respective counter value, wherein each clock generator circuit stores the respective counter value, receives a reference clock from a reference clock generator circuit of the electronic circuit, changes the respective counter value in accordance with the reference clock and generates at least one clock signal based on the counter value;
comparing the received counter values; and
selectively initiating an error handling operation based on the result of the comparison.

19. The method of claim 18, wherein initiating an error handling operation comprises triggering an alarm.

* * * * *